(12) United States Patent
Ma et al.

(10) Patent No.: US 12,407,339 B2
(45) Date of Patent: Sep. 2, 2025

(54) ATTENUATOR USING VARIABLE RESISTORS

(71) Applicant: QUALCOMM Incorporated, San Diego, CA (US)

(72) Inventors: Lei Ma, Palo Alto, CA (US); Chenliang Du, San Diego, CA (US); Antonino Scuderi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 26 days.

(21) Appl. No.: 18/338,685

(22) Filed: Jun. 21, 2023

(65) Prior Publication Data

US 2024/0429907 A1 Dec. 26, 2024

(51) Int. Cl.
*H03K 5/08* (2006.01)
*H03K 5/02* (2006.01)

(52) U.S. Cl.
CPC .............. *H03K 5/08* (2013.01); *H03K 5/02* (2013.01)

(58) Field of Classification Search
None
See application file for complete search history.

(56) References Cited

U.S. PATENT DOCUMENTS

| | | | |
|---|---|---|---|
| 6,271,727 B1 | 8/2001 | Schmukler | |
| 7,102,428 B2 | 9/2006 | Behzad | |
| 7,786,822 B2 | 8/2010 | Vice | |
| 11,057,067 B1 * | 7/2021 | Hickle | H04B 1/109 |
| 11,791,783 B2 * | 10/2023 | Lee | H03F 1/0288 |
| | | | 330/124 R |

OTHER PUBLICATIONS

Boroujeni S.R., et al., "A High-Efficiency 27-30-GHz 130-nm Bi-CMOS Transmitter Front End for SATCOM Phased Arrays", Transactions on Microwave Theory and Techniques, IEEE, USA, Nov. 4, 2021, XP011886865, ISSN: 0018-9480, vol. 69, No. Nov. 11, 2021, pp. 4977-4985, p. 4977, Left-hand Column, Line 24—p. 4984, Right-hand Column Line 32, Figures 1-17.
International Search Report and Written Opinion—PCT/US2024/030385—ISA/EPO—Sep. 16, 2024.
Kholodnyak D.V., "Metamaterial Transmission Lines and Their Applications", IEEE, Conference of Russian Young Researchers in Electrical and Electronic Engineering (EICONRUS), Feb. 1, 2017, pp. 3-8, XP033088542, p. 4, left-hand Column, lines 1-19, figure 1.
Yishay R.B., et al., "W-Band SiGe Attenuators Based on Compact Low-VSWR Topologies", IEEE MTT-S International Microwave Symposium (IMS), Jun. 4, 2017, XP033159735, DOI: 10.1109/MWSYM.2017.8058650, p. 638, Left-hand Column, Line 17—p. 640, Left-hand Column, Line 37, Figures 1-9, 2017, pp. 638-641.

* cited by examiner

*Primary Examiner* — Cassandra F Cox
(74) *Attorney, Agent, or Firm* — Patterson + Sheridan, L.L.P.

(57) ABSTRACT

Certain aspects of the present disclosure are directed towards a signal processing circuit. The signal processing circuit generally includes: an impedance transformation circuit coupled between a first node and a second node; and an attenuation circuit including a first variable resistive element coupled between the first node and a reference potential node, and a second variable resistive element coupled between the second node and the reference potential node.

27 Claims, 6 Drawing Sheets

ATTENUATOR USING VARIABLE RESISTORS

FIELD OF THE DISCLOSURE

Certain aspects of the present disclosure generally relate to electronic components and, more particularly, to circuitry for signal amplification and attenuation.

BACKGROUND

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include transmitters for processing signals for transmission via antennas. A transmitter may include a power amplifier (PA) for amplifying a signal for transmission.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards a signal processing circuit. The signal processing circuit generally includes: an impedance transformation circuit coupled between a first node and a second node; and an attenuation circuit including a first variable resistive element coupled between the first node and a reference potential node, and a second variable resistive element coupled between the second node and the reference potential node.

Certain aspects of the present disclosure are directed towards a wireless device. The wireless device generally includes: a controller configured to determine a power mode associated with signal transmission; an attenuator comprising a first variable resistive element coupled between a first node and a reference potential node, and a second variable resistive element coupled between a second node and the reference potential node, wherein an impedance transformation circuit is coupled between the first node and the second node, and wherein the controller is configured to bias the first variable resistive element and the second variable resistive element to generate an attenuator signal based on an input signal; and an amplifier coupled to the attenuator and configured to generate a signal for transmission based on the attenuator signal.

Certain aspects of the present disclosure are directed towards a method for signal processing. The method generally includes receiving an input signal and generating, via an attenuation circuit, an attenuator signal based on the input signal, the attenuation circuit comprising: a first variable resistive element coupled between a first node and a reference potential node, and a second variable resistive element coupled between a second node and the reference potential node, wherein an impedance transformation circuit is coupled between the first node and the second node.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to a signal processing circuit, including an attenuation circuit. The attenuation circuit may include a first variable resistive element coupled between a first node and a reference potential node and a second variable resistive coupled between a second node and the reference potential node. An impedance transformation circuit may be coupled between the first node and the second node. The signal processing circuit may be part of a transmitter that may operate in either a high-power mode (HPM) or a low-power mode (LPM). During the HPM, the first and second variable resistive elements may be configured with high impedance (e.g., effectively an open circuit), reducing any impact of the attenuation circuit on the HPM performance. In the LPM, the first and second variable resistive elements may be biased to generate an attenuated signal, which may be amplified by one or more power amplifiers (PAs) in the transmitter.

Example Wireless Communications

Figure 1:
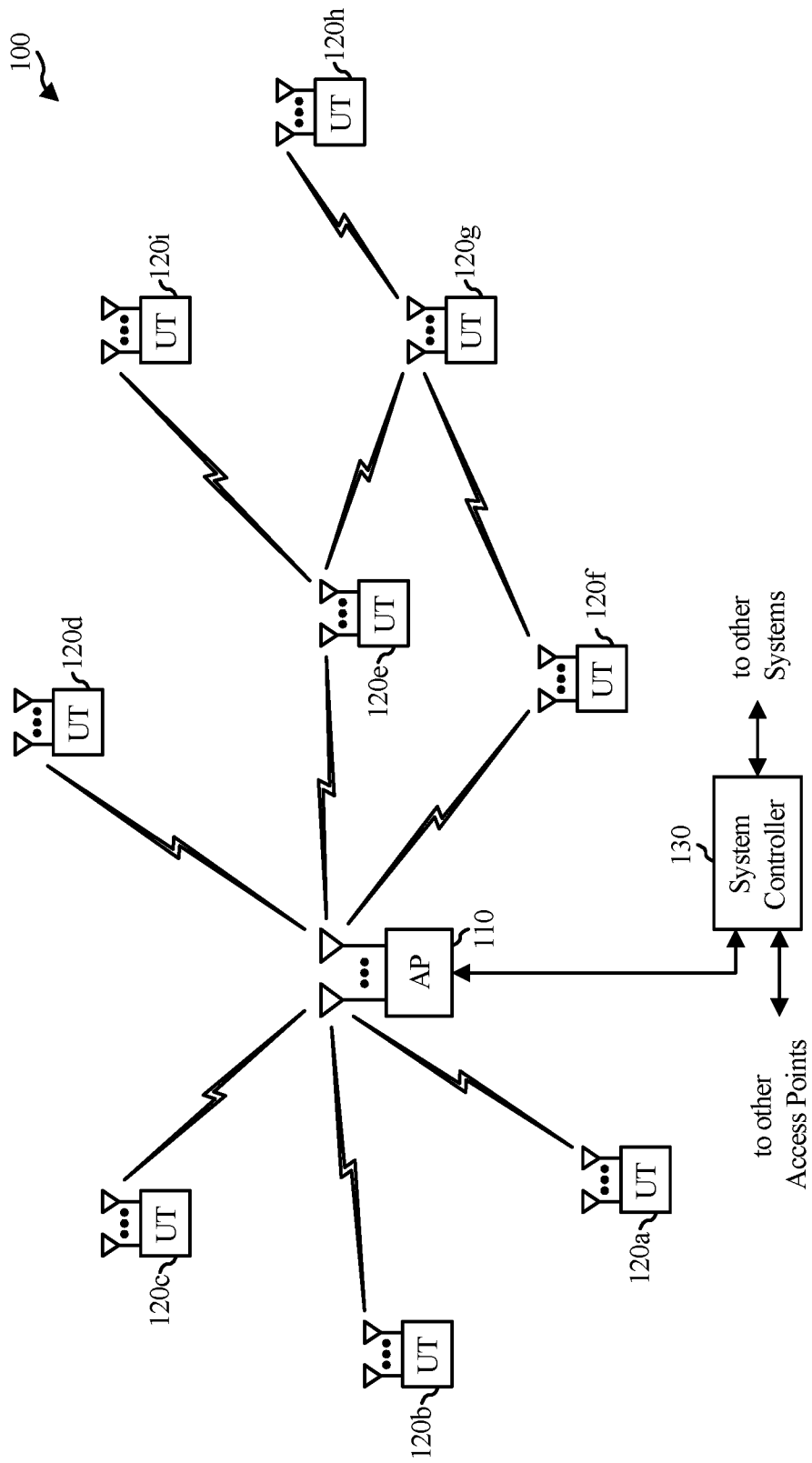
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set Nu of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The Nu selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported).

In some aspects, the user terminal 120 or access point 110 may include an attenuator having one or more variable resistive elements, which may be coupled to an input of an amplifier, as described in more detail herein.

Figure 2:
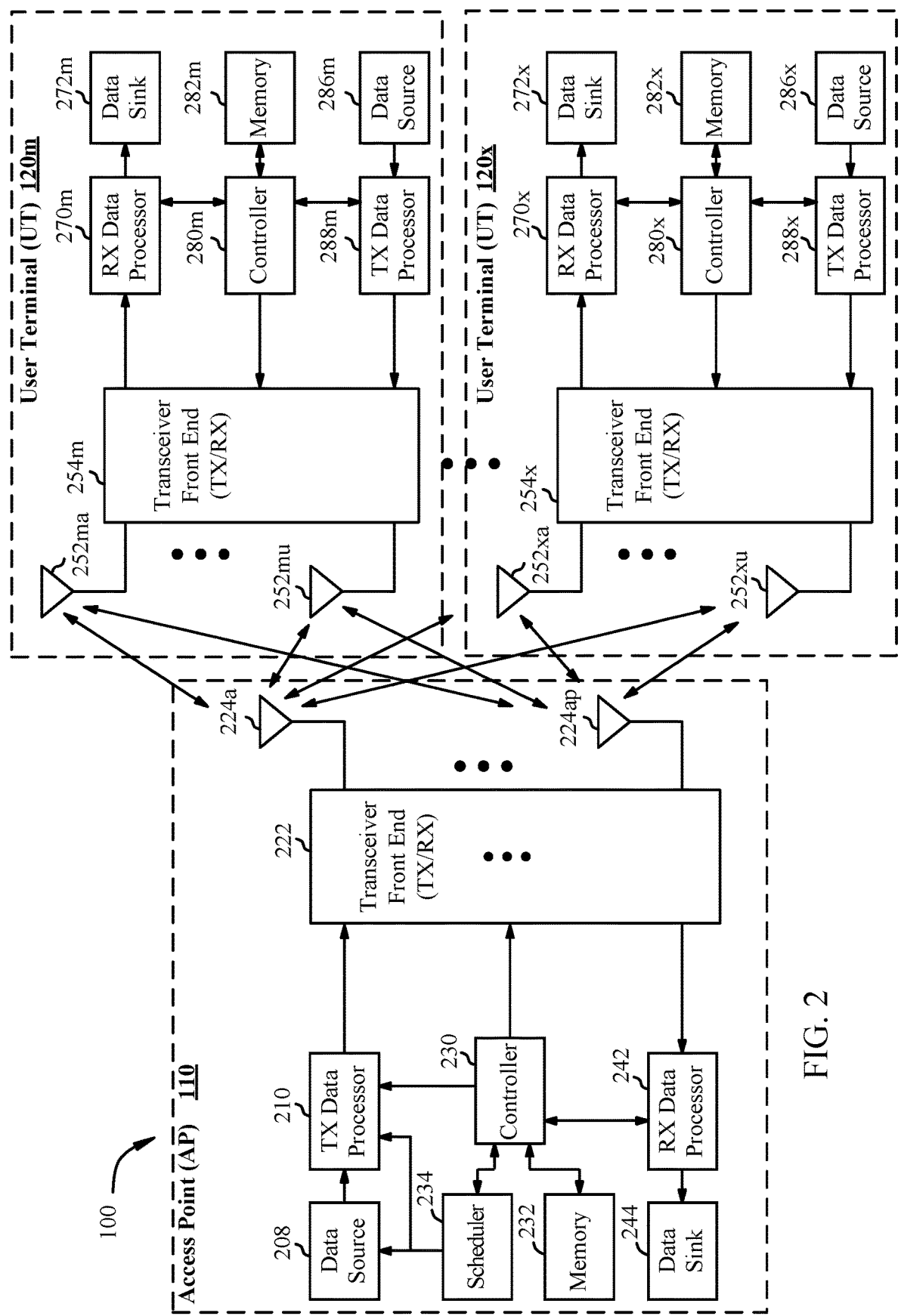
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

In some aspects, the transceiver front end 254 or 222 may include an amplifier and an attenuator having one or more variable resistive elements, as described in more detail herein.

Figure 3:
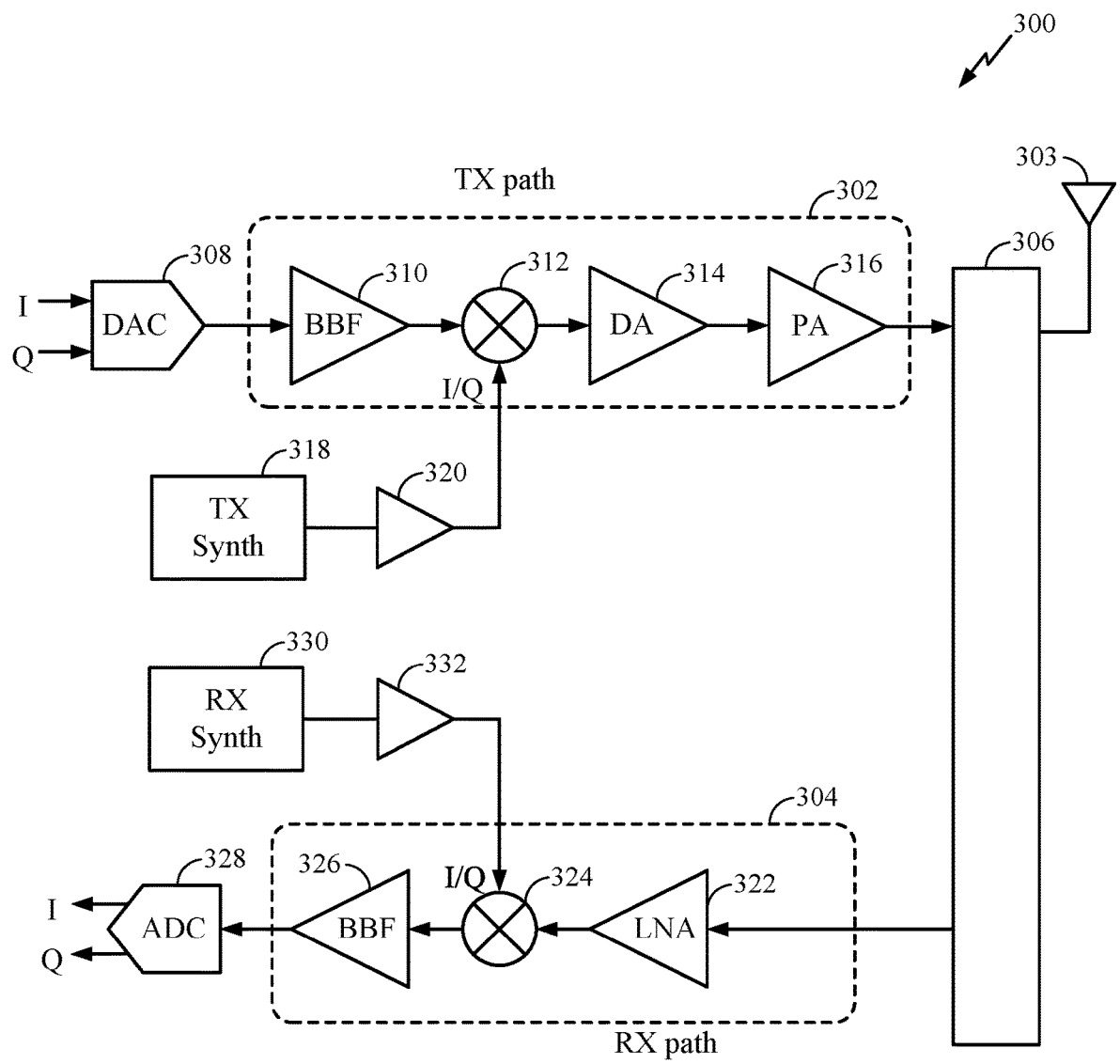
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes at least one transmit (TX) path 302 (also known as a "transmit chain") for transmitting signals via one or more antennas and at least one receive (RX) path 304 (also known as a "receive chain") for receiving signals via the antennas. When the TX path 302 and the RX path 304 share an antenna 303, the paths may be connected with the antenna via an interface 306, which may include any of various suitable radio frequency (RF) devices, such as a switch, a duplexer, a diplexer, a multiplexer, and the like.

Receiving in-phase (I) and/or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, the DA 314, and the PA 316 may be included in a radio frequency integrated circuit (RFIC). In some cases, the PA 316 may be external to the RFIC. In some aspects, the input of the DA 314 may be coupled to an attenuator having variable resistive elements, as described in more detail herein. Alternatively or additionally, the attenuator may be coupled to an input of the PA 316. The attenuator may share the same semiconductor die (e.g., a gallium arsenide (GaAs) die) as the DA 314 and/or the PA 316.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 312 are typically RF signals, which may be amplified by the DA 314 and/or by the PA 316 before transmission by the antenna 303. While one mixer 312 is illustrated, several mixers may be used to upconvert the filtered baseband signals to one or more intermediate frequencies and to thereafter upconvert the intermediate frequency (IF) signals to a frequency for transmission.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In some cases, a single frequency synthesizer may be used for both the TX path 302 and the RX path 304.

Example Attenuation Circuit

Some wireless devices may use a multi-mode-multi-band (MMMB) power amplifier (PA), such that a single PA can support multiple modes and multiple frequency bands, to save cost and area. A typical MMMB PA performs well in a high-power mode (HPM) when a signal transmission occurs with high power because the PA may be specifically tuned for HPM. However, in some conditions, the PA may not transmit with high power, and a low-power transmission may be sufficient for a user equipment (UE) to transmit a signal (e.g., to a base station). For a typical PA designed with a 30 dB gain (e.g., implemented via a two-stage or three-stage PA) in HPM, in low-power mode (LPM), the PA gain may be high (e.g., even with a lowered rail voltage (Vcc) and reference current (Iref) for the PA), which may cause a problem for meeting a high dynamic range transceiver specification. Implementing an attenuator that allows for further reduction of gain in LPM may reduce HPM performance.

Certain aspects of the present disclosure are directed towards an attenuator (e.g., a gallium arsenide (GaAs) radio-frequency (RF) attenuator) implemented using variable resistive elements. The attenuator allows for maintaining high-power mode (HPM) performance, while allowing for a programmable low-power mode (LPM) gain and maintaining signal linearity. A tunable input attenuator may be used to reduce the overall power gain in the LPM to maintain a signal-to-noise ratio (SNR) at a transmitter output. The attenuator may be turned on in the LPM (e.g., providing over 10 dB attenuation), with little to no impact on input matching and linearity. The attenuator may be turned off in the HPM with little to no insertion loss or effect on input matching and linearity.

Figure 4:
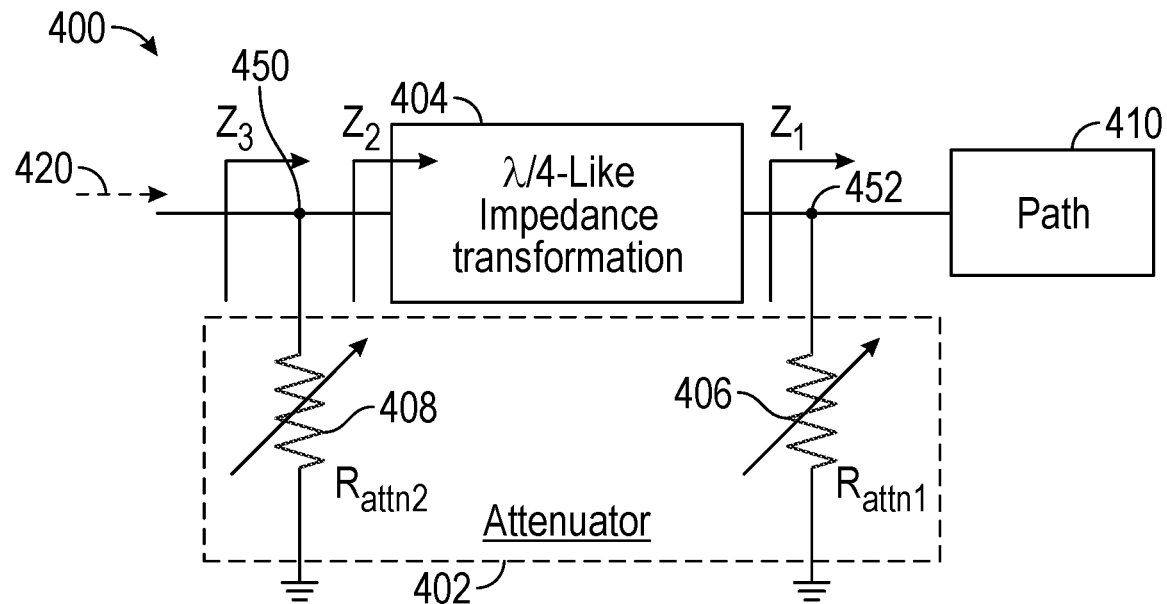
FIG. 4 illustrates an example signal processing circuit, in accordance with certain aspects of the present disclosure.

FIG. 4 illustrates an example signal processing circuit 400, in accordance with certain aspects of the present disclosure. The circuit may include an example attenuator 402 and an example impedance transformation circuit 404 coupled between node 450 and node 452. As shown, the attenuator includes a variable resistive element 406 (e.g., having a first resistance $R_{attn1}$) and a variable resistive element 408 (e.g., having a second resistance $R_{attn2}$), such that the attenuator is programmable. While both resistive elements 406, 408 are variable resistive elements in the example signal processing circuit 400, only one of the resistive elements 406, 408 may be variable in some aspects (not shown). The impedance transformation circuit 404 may be implemented by a quarter-wave impedance transformer used for input impedance matching (e.g., impedance matching by setting an impedance Z3 looking into the signal processing circuit 400 from an input path 420).

The programmable attenuator may be used with little to no effect on input matching. When operating in HPM, the attenuator may be in an off state or otherwise effectively disabled. For example, the variable resistive element 406 and the variable resistive element 408 may be configured with high impedance (e.g., effectively an open circuit). This may be accomplished by implementing each of the variable resistive elements 406, 408 with one or more transistors, for example.

When operating in LPM, the attenuator may be in an on state (e.g., enabled). For example, the variable resistive element 406 may be biased to provide resistance $R_{attn1}$. Resistance $R_{attn1}$ lowers the impedance $Z_1$ looking into an amplification path 410 (e.g., of the DA or the PA), as shown. Due to the impedance transformation circuit 404, the lower impedance $Z_1$ increases impedance $Z_2$ looking into the impedance transformation circuit 404. Without compensating for the increase of impedance $Z_2$, impedance $Z_3$ would be increased (e.g., adversely impacting input matching). In some aspects, to compensate, at least adjust, for the increase of impedance $Z_2$, the resistive element 408 may be biased to provide a resistance $R_{attn2}$ that counteracts the effect of resistance Rattni on impedance $Z_3$. Thus, resistance $R_{attn2}$ configures impedance $Z_3$ in an impedance-matched condition, while both resistances $R_{attn1}$ and $R_{attn2}$ contribute to the attenuation of input signaling (e.g., for the PA).

In some aspects, the tunable attenuator 402 may be integrated with the PA on the same semiconductor die fabricated with a GaAs or indium gallium phosphide (In-GaP) heterojunction bipolar transistor (HBT) process, which may provide a more compact and lower cost implementation as compared to conventional complementary metal-oxide-semiconductor (CMOS) implementations (e.g., used in sub-6 GHz RF front-end modules to achieve gain reduction in LPM and reduce SNR degradation at low transmitter output power). When the attenuator 402 is in an off state in HPM, the attenuator 402 may have little to no impact on HPM performance. During the on state in LPM, the attenuator 402 provides attenuation (e.g., greater than 10 dB), which may be independent of input power.

Figure 5:
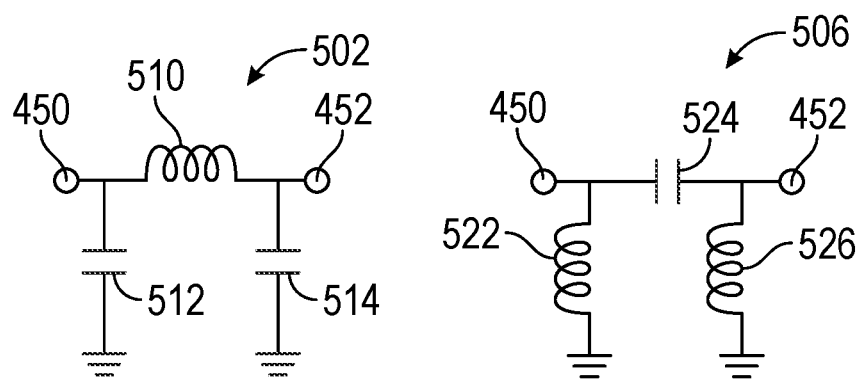
FIG. 5 illustrates example impedance transformation circuits, in accordance with certain aspects of the present disclosure.

FIG. 5 illustrates example impedance transformation circuits 502, 506, in accordance with certain aspects of the present disclosure. As shown, the impedance transformation circuit 404 of FIG. 4 may be implemented using one of the impedance transformation circuits 502, 506. Other circuits may be used to implement the impedance transformation circuit 404.

Implemented as a Π-network, the impedance transformation circuit 502 may include: (i) a capacitive element 512 coupled between a first terminal of an inductive element 510 and a reference potential node (e.g., electrical ground) and (ii) a capacitive element 514 coupled between a second terminal of the inductive element 510 and the reference potential node. The first terminal of the inductive element 510 is coupled to the node 450, and the second terminal of the inductive element 510 is coupled to the node 452.

Also implemented as a Π-network, the impedance transformation circuit 506 may include: (i) an inductive element 522 coupled between a first terminal of a capacitive element 524 and a reference potential node (e.g., electrical ground) and (ii) an inductive element 526 coupled between a second terminal of the capacitive element 524 and the reference potential node. The first terminal of the capacitive element 524 is coupled to the node 450, and the second terminal of the capacitive element 524 is coupled to the node 452.

Figure 6:
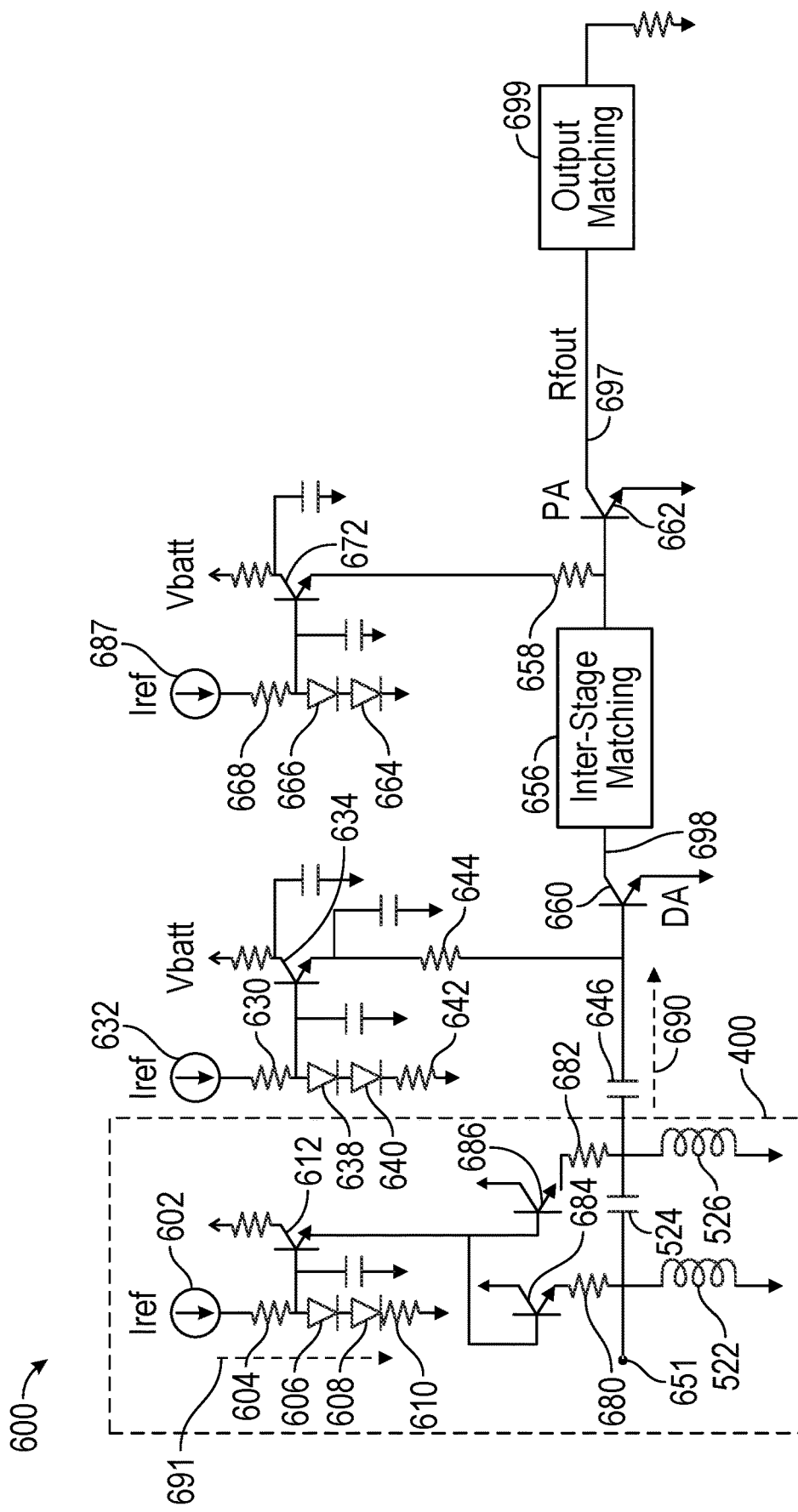
FIG. 6 illustrates an example amplification circuit including attenuation and impedance transformation circuits, in accordance with certain aspects of the present disclosure.

FIG. 6 illustrates an example signal processing circuit 600 including the signal processing circuit 400, in accordance with certain aspects of the present disclosure. The signal processing circuit 600 may include an amplification path 690 that may receive a bias signal. For example, a transistor 634 (e.g., also referred to herein as a "bias transistor") may have an emitter coupled to a base of a transistor 660 (e.g., for implementing a DA) through a resistive element 644. The collector of transistor 634 may be coupled to a voltage rail (e.g., coupled to a power source such as a battery providing a battery voltage (Vbatt)). A current source 632 may source a reference current (Iref) across resistive element 630, diodes 638, 640, and resistive element 642, generating a voltage at the base of transistor 634. Thus, the transistor 634 may be biased, providing a bias signal (e.g., bias current) for biasing the transistor 660 for the DA.

As shown, the amplification path 690 may include a ballasting capacitive element 646. The collector of transistor 660 may be coupled to a DA output node 698. The DA output node 698 may be coupled to a base of a transistor 662 (e.g., for implementing a PA) through an inter-stage matching circuit 656 for impedance matching. The collector of transistor 662 may be coupled to an output node 697 (e.g., providing an output RF signal labeled "Rfout"), providing a signal for transmission (e.g., through an output impedance matching circuit 699). As shown, a reference current may be provided for biasing the PA (e.g., transistor 662). For example, a transistor 672 may have an emitter coupled to a base of transistor 662 through a resistive element 658. The collector of transistor 672 may be coupled to the voltage rail. A current source 687 may source a reference current across resistive element 668 and diodes 664, 666, generating a voltage at the base of transistor 672. Thus, the transistor 672 may be biased, providing a bias signal for biasing the transistor 662 for the PA.

In some aspects of the present disclosure, the amplification path 690 may include the signal processing circuit 400 described with respect to FIG. 4. As shown in FIG. 6, the signal processing circuit 400 may be implemented with the impedance transformation circuit 506, but may be implemented with any suitable impedance transformation circuit. In this example, the signal processing circuit 400 may include an inductive element 522 coupled between a first terminal of a capacitive element 524 and a reference potential node (e.g., electrical ground) and an inductive element 526 coupled between a second terminal of the capacitive element 524 and the reference potential node. The first terminal of the capacitive element 524 is coupled to the input node 651 (e.g., corresponding to node 450 of FIG. 4), and the second terminal of the capacitive element 524 may be coupled to the capacitive element 646.

The signal processing circuit 400 may include a resistive element 682 and a transistor 686 (e.g., also referred to herein as an "attenuation transistor") used to implement a variable resistive element (e.g., corresponding to the variable resistive element 406 of FIG. 4). The signal processing circuit 400 may also include a resistive element 680 and a transistor 684 (e.g., also referred to herein as an "attenuation transistor") used to implement another variable resistive element (e.g., corresponding to the variable resistive element 408 of FIG. 4). The transistors 684, 686 may be HBTs. The transistors 684, 686 (and the resistive elements 680, 682) may be on the same semiconductor die (a GaAs or InGaP die) as the transistor 660 and/or the transistor 662. As shown, the collectors of transistors 684, 686 may be coupled to a voltage rail, as shown. The emitters of transistors 684, 686 may be coupled to resistive elements 680, 682, respectively. The transistor 686 may be biased to set resistance $R_{attn1}$, and the transistor 684 may be biased to set resistance $R_{attn2}$. For example, the signal processing circuit 400 may include a bias circuit having a transistor 612 (e.g., also referred to herein as a "bias transistor"). The transistor 612 may be biased to control the variable resistive elements implemented via transistors 684, 686. For example, transistor 612 may have an emitter coupled to bases of transistors 684, 686. The collector of transistor 612 may be coupled to the voltage rail, as shown. While a single bias circuit (e.g., bias transistor 612) is shown for controlling both transistors 684, 686, separate bias circuits may be used to individually bias transistors 684, 686 in some aspects.

A current source 602 may source a reference current to a current path 691 (e.g., across resistive element 604, diodes 606, 608, and resistive element 610), generating a voltage at the base of transistor 612. Thus, the transistor 612 may be biased, providing a bias signal for biasing the transistors 684, 686 to set an attenuation level of the attenuator (e.g., by adjusting the collector-to-emitter impedance of transistors 684, 686).

The signal processing circuit 400 may provide a quarter-wave response input matching. Thus, variable resistive elements 406, 408 may move the forward transmission (e.g., scattering parameter S11) in opposite directions (e.g., on a Smith chart). Thus, the input return loss (IRL) of the signal processing circuit 600 may be maintained with attenuation using the signal processing circuit 400.

Figure 7:
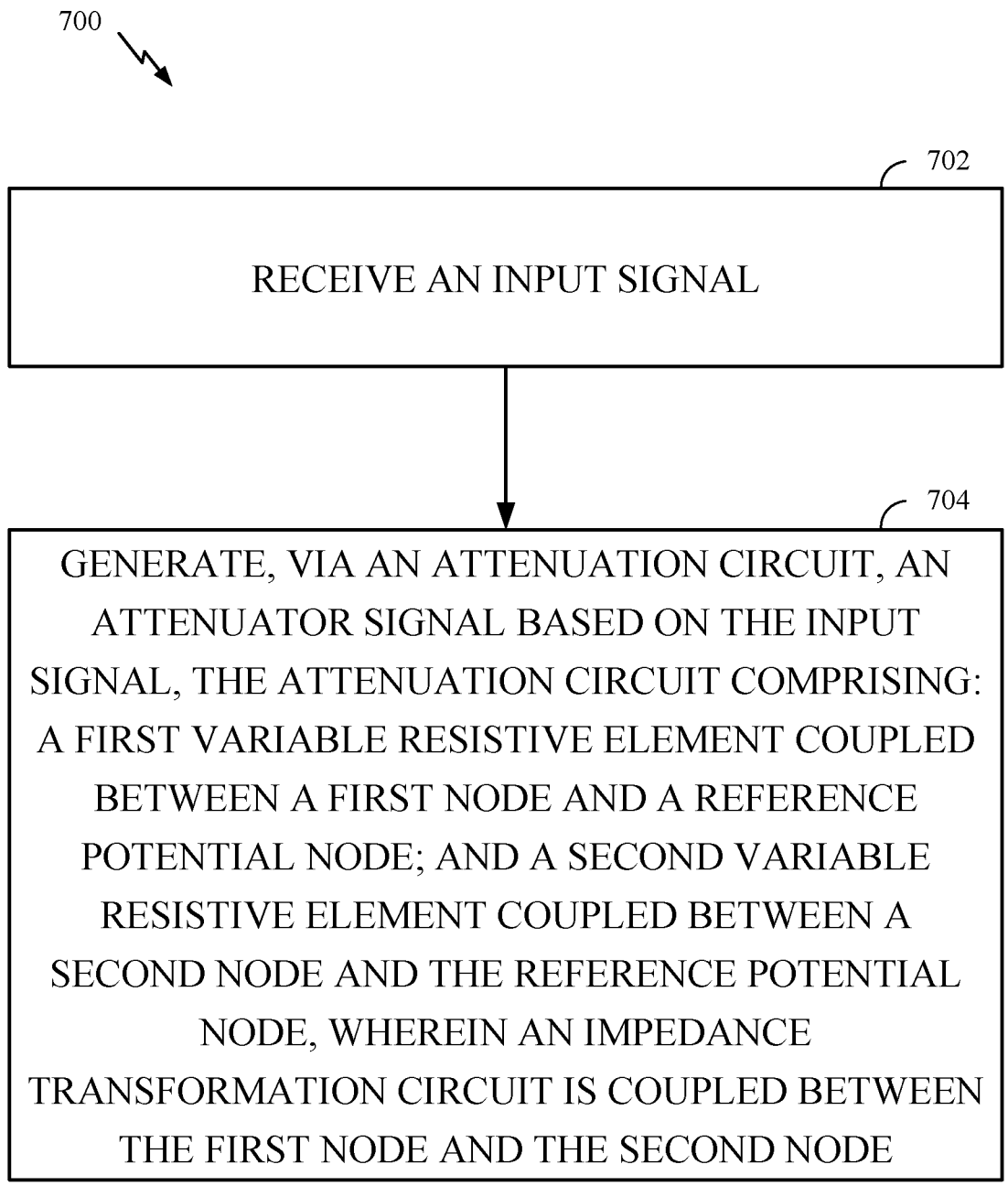
FIG. 7 is a flow diagram depicting example operations for signal processing, in accordance with certain aspects of the present disclosure.

FIG. 7 is a flow diagram depicting example operations 700 for signal processing, in accordance with certain aspects of the present disclosure. For example, the operations 700 may be performed by an electrical device such as an attenuation circuit (e.g., attenuator 402), and in some aspects, a signal processing circuit such as the signal processing circuit 600.

The operations 700 begin, at block 702, with the electrical device receiving an input signal (e.g., at input node 651). At block 704, the electrical device generates, via an attenuation circuit (e.g., attenuator 402), an attenuator signal based on the input signal. In some cases (e.g., LPM), the attenuator signal may be an attenuated version of the input signal (e.g., an attenuated signal). In some aspects, the attenuation circuit includes a first variable resistive element (e.g., variable resistive element 408) coupled between a first node (e.g., node 450 or input node 651) and a reference potential node. The attenuation circuit may also include a second variable resistive element (e.g., variable resistive element 406) coupled between a second node (e.g., node 452) and the reference potential node. An impedance transformation circuit (e.g., impedance transformation circuit 404) is coupled between the first node and the second node. In some aspects, the electrical device may generate an amplified signal based on the attenuator signal via an amplification transistor (e.g., transistor 660) coupled to the second node.

In some aspects, the electrical device determines a power mode (e.g., LPM or HPM) associated with signal amplification. The electrical device may control the first variable resistive element and the second variable resistive element based on the power mode. For example, the first variable resistive element may include a first attenuation transistor (e.g., transistor 684) coupled between the first node and a voltage rail, and the second variable resistive element may include a second attenuation transistor (e.g., transistor 686) coupled between the second node and the voltage rail. The electrical device may turn off the first attenuation transistor and the second attenuation transistor based on the power mode being a high-power mode (HPM). The electrical device may bias, via a bias circuit, the first attenuation transistor and the second attenuation transistor based on the power mode being a low-power mode (LPM). For instance, the bias circuit may include a bias transistor (e.g., transistor 612) coupled between the voltage rail and at least one of a base of the first attenuation transistor or a base of the second attenuation transistor. The bias transistor may be coupled between the voltage rail and the bases of the first attenuation transistor and the second attenuation transistor, in some aspects. The electrical device may source, via a current source (e.g., current source 602) of the bias circuit, a current to a current path (e.g., current path 691) coupled to a base of the bias transistor.

In some aspects, the first variable resistive element may also include a first resistive element (e.g., resistive element 680) coupled between the first node and an emitter of the first attenuation transistor. The second variable resistive element may also include a second resistive element (e.g., resistive element 682) coupled between the second node and an emitter of the second attenuation transistor.

In some aspects, the impedance transformation circuit may include: a first inductive element (e.g., inductive element 522) coupled between the first node and the reference potential node, a second inductive element (e.g., inductive element 526) coupled between the second node and the reference potential node, and a capacitive element (e.g., capacitive element 524) coupled between the first node and the second node.

In some aspects, the impedance transformation circuit may include: a first capacitive element (e.g., capacitive element 512) coupled between the first node and the reference potential node, a second capacitive element (e.g., capacitive element 514) coupled between the second node and the reference potential node, and an inductive element (e.g., inductive element 510) coupled between the first node and the second node.

Example Aspects

Aspect 1: A signal processing circuit, comprising: an impedance transformation circuit coupled between a first node and a second node; and an attenuation circuit including: a first variable resistive element coupled between the first node and a reference potential node; and a second variable resistive element coupled between the second node and the reference potential node.

Aspect 2: The signal processing circuit of Aspect 1, wherein the impedance transformation circuit includes: a first inductive element coupled between the first node and the reference potential node; a second inductive element coupled between the second node and the reference potential node; and a capacitive element coupled between the first node and the second node.

Aspect 3: The signal processing circuit of Aspect 1 or 2, wherein the impedance transformation circuit includes: a first capacitive element coupled between the first node and the reference potential node; a second capacitive element coupled between the second node and the reference potential node; and an inductive element coupled between the first node and the second node.

Aspect 4: The signal processing circuit according to any of Aspects 1-3, wherein: the first variable resistive element includes a first attenuation transistor coupled between the first node and a voltage rail; and the second variable resistive element includes a second attenuation transistor coupled between the second node and the voltage rail.

Aspect 5: The signal processing circuit of Aspect 4, further comprising a bias transistor coupled between the voltage rail and at least one of a base of the first attenuation transistor or a base of the second attenuation transistor.

Aspect 6: The signal processing circuit of Aspect 5, wherein the bias transistor is coupled between the voltage rail and the bases of the first attenuation transistor and the second attenuation transistor.

Aspect 7: The signal processing circuit of Aspect 5 or 6, further comprising a current source coupled to a current path, the current path being coupled to a base of the bias transistor.

Aspect 8: The signal processing circuit according to any of Aspects 4-7, wherein: the first variable resistive element further comprises a first resistive element coupled between the first node and an emitter of the first attenuation transistor; and the second variable resistive element further comprises a second resistive element coupled between the second node and an emitter of the second attenuation transistor.

Aspect 9: The signal processing circuit according to any of Aspects 1-8, further comprising: an amplification transistor; and a capacitive element coupled between the attenuation circuit and a base of the amplification transistor.

Aspect 10: The signal processing circuit according to any of Aspects 1-9, wherein: in a high-power mode (HPM) associated with the signal processing circuit, at least one of the first variable resistive element or the second variable resistive element is configured to have a first resistance; and in a low-power mode (LPM) associated with the signal processing circuit, at least one of the first variable resistive element or the second variable resistive element is configured to have a second resistance less than the first resistance.

Aspect 11: A wireless device, comprising: a controller configured to determine a power mode associated with signal transmission; an attenuator comprising: a first variable resistive element coupled between a first node and a reference potential node; and a second variable resistive element coupled between a second node and the reference potential node, wherein the controller is configured to bias the first variable resistive element and the second variable resistive element to generate an attenuator signal based on an input signal; an impedance transformation circuit coupled between the first node and the second node; and an amplifier coupled to the attenuator and configured to generate a signal for transmission based on the attenuator signal.

Aspect 12: The wireless device of Aspect 11, wherein: the first variable resistive element includes a first attenuation transistor coupled between the first node and a voltage rail; and the second variable resistive element includes a second attenuation transistor coupled between the second node and the voltage rail.

Aspect 13: The wireless device of Aspect 12, wherein the controller is further configured to turn off the first attenuation transistor and the second attenuation transistor based on the power mode being a high-power mode (HPM).

Aspect 14: The wireless device of Aspect 12 or 13, wherein, to bias the first variable resistive element and the second variable resistive element, the controller is configured to bias, via a bias circuit, the first attenuation transistor and the second attenuation transistor based on the power mode being a low-power mode (LPM).

Aspect 15: The wireless device of Aspect 14, wherein the bias circuit comprises a bias transistor coupled between a voltage rail and at least one of a base of the first attenuation transistor or a base of the second attenuation transistor.

Aspect 16: The wireless device of Aspect 15, wherein the bias transistor is coupled between the voltage rail and the bases of the first attenuation transistor and the second attenuation transistor.

Aspect 17: The wireless device of Aspect 15 or 16, wherein, to bias the first variable resistive element and the second variable resistive element, the controller is configured to control a current source to provide a current to a current path coupled to a base of the bias transistor.

Aspect 18: A method for signal processing, comprising: receiving an input signal; and generating, via an attenuation circuit, an attenuator signal based on the input signal, the attenuation circuit comprising: a first variable resistive element coupled between a first node and a reference potential node; and a second variable resistive element coupled between a second node and the reference potential node, wherein an impedance transformation circuit is coupled between the first node and the second node.

Aspect 19: The method of Aspect 18, further comprising generating an amplified signal based on the attenuator signal via an amplification transistor coupled to the second node.

Aspect 20: The method of Aspect 18 or 19, further comprising: determining a power mode associated with signal amplification; and controlling the first variable resistive element and the second variable resistive element based on the power mode.

Aspect 21: The method of Aspect 20, wherein: the first variable resistive element includes a first attenuation transistor coupled between the first node and a voltage rail; and the second variable resistive element includes a second attenuation transistor coupled between the second node and the voltage rail.

Aspect 22: The method of Aspect 21, further comprising turning off the first attenuation transistor and the second attenuation transistor based on the power mode being a high-power mode (HPM).

Aspect 23: The method of Aspect 21 or 22, further comprising biasing, via a bias circuit, the first attenuation transistor and the second attenuation transistor based on the power mode being a low-power mode (LPM).

Aspect 24: The method of Aspect 23, wherein the bias circuit comprises a bias transistor coupled between the voltage rail and at least one of a base of the first attenuation transistor or a base of the second attenuation transistor.

Aspect 25: The method of Aspect 24, wherein the bias transistor is coupled between the voltage rail and the bases of the first attenuation transistor and the second attenuation transistor.

Aspect 26: The method of Aspect 24 or 25, wherein biasing the first attenuation transistor and the second attenuation transistor includes sourcing, via a current source of the bias circuit, a current to a current path coupled to a base of the bias transistor.

Aspect 27: The method according to any of Aspects 21-26, wherein: the first variable resistive element further comprises a first resistive element coupled between the first node and an emitter of the first attenuation transistor; and the second variable resistive element further comprises a second resistive element coupled between the second node and an emitter of the second attenuation transistor.

Aspect 28: The method according to any of Aspects 18-27, wherein the impedance transformation circuit includes: a first inductive element coupled between the first node and the reference potential node; a second inductive element coupled between the second node and the reference potential node; and a capacitive element coupled between the first node and the second node.

Aspect 29: The method according to any of Aspects 18-28, wherein the impedance transformation circuit includes: a first capacitive element coupled between the first node and the reference potential node; a second capacitive element coupled between the second node and the reference potential node; and an inductive element coupled between the first node and the second node.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112 (f) unless the element is expressly recited using the phrase "means for" or, in the case of a method claim, the element is recited using the phrase "step for." For example, means for determining may a digital controller such as digital controller 510.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A signal processing circuit, comprising:
   an impedance transformation circuit coupled between a first node and a second node; and
   an attenuation circuit including:
      a first variable resistive element including a first attenuation transistor coupled between the first node and a voltage rail; and
      a second variable resistive element including a second attenuation transistor coupled between the second node and the voltage rail.

2. The signal processing circuit of claim 1, wherein the impedance transformation circuit includes:
   a first inductive element coupled between the first node and a reference potential node;
   a second inductive element coupled between the second node and the reference potential node; and
   a capacitive element coupled between the first node and the second node.

3. The signal processing circuit of claim 1, wherein the impedance transformation circuit includes:
   a first capacitive element coupled between the first node and a reference potential node;
   a second capacitive element coupled between the second node and the reference potential node; and
   an inductive element coupled between the first node and the second node.

4. The signal processing circuit of claim 1, further comprising a bias transistor coupled between the voltage rail and at least one of a base of the first attenuation transistor or a base of the second attenuation transistor.

5. The signal processing circuit of claim 4, wherein the bias transistor is coupled between the voltage rail and the bases of the first attenuation transistor and the second attenuation transistor.

6. The signal processing circuit of claim 4, further comprising a current source coupled to a current path, the current path being coupled to a base of the bias transistor.

7. The signal processing circuit of claim 1, wherein:
the first variable resistive element further comprises a first resistive element coupled between the first node and an emitter of the first attenuation transistor; and
the second variable resistive element further comprises a second resistive element coupled between the second node and an emitter of the second attenuation transistor.

8. The signal processing circuit of claim 1, further comprising:
an amplification transistor; and
a capacitive element coupled between the attenuation circuit and a base of the amplification transistor.

9. The signal processing circuit of claim 1, wherein:
in a high-power mode (HPM) associated with the signal processing circuit, at least one of the first variable resistive element or the second variable resistive element is configured to have a first resistance; and
in a low-power mode (LPM) associated with the signal processing circuit, at least one of the first variable resistive element or the second variable resistive element is configured to have a second resistance less than the first resistance.

10. A wireless device, comprising:
a controller configured to determine a power mode associated with signal transmission;
an attenuator comprising:
    a first variable resistive element coupled between a first node and a reference potential node or a voltage rail; and
    a second variable resistive element coupled between a second node and the reference potential node or the voltage rail, wherein the controller is configured to bias the first variable resistive element and the second variable resistive element to generate an attenuator signal based on an input signal;
an impedance transformation circuit coupled between the first node and the second node; and
an amplifier coupled to the attenuator and configured to generate a signal for transmission based on the attenuator signal.

11. The wireless device of claim 10, wherein:
the first variable resistive element includes a first attenuation transistor coupled between the first node and the voltage rail; and
the second variable resistive element includes a second attenuation transistor coupled between the second node and the voltage rail.

12. The wireless device of claim 11, wherein the controller is further configured to turn off the first attenuation transistor and the second attenuation transistor based on the power mode being a high-power mode (HPM).

13. The wireless device of claim 11, wherein, to bias the first variable resistive element and the second variable resistive element, the controller is configured to bias, via a bias circuit, the first attenuation transistor and the second attenuation transistor based on the power mode being a low-power mode (LPM).

14. The wireless device of claim 13, wherein the bias circuit comprises a bias transistor coupled between the voltage rail and at least one of a base of the first attenuation transistor or a base of the second attenuation transistor.

15. The wireless device of claim 14, wherein the bias transistor is coupled between the voltage rail and the bases of the first attenuation transistor and the second attenuation transistor.

16. The wireless device of claim 14, wherein, to bias the first variable resistive element and the second variable resistive element, the controller is configured to control a current source to provide a current to a current path coupled to a base of the bias transistor.

17. A method for signal processing, comprising:
receiving an input signal; and
generating, via an attenuation circuit, an attenuator signal based on the input signal, the attenuation circuit comprising:
    a first variable resistive element including a first attenuation transistor coupled between a first node and a voltage rail; and
    a second variable resistive element including a second attenuation transistor coupled between a second node and the voltage rail, wherein an impedance transformation circuit is coupled between the first node and the second node.

18. The method of claim 17, further comprising generating an amplified signal based on the attenuator signal via an amplification transistor coupled to the second node.

19. The method of claim 17, further comprising:
determining a power mode associated with signal amplification; and
controlling the first variable resistive element and the second variable resistive element based on the power mode.

20. The method of claim 19, further comprising turning off the first attenuation transistor and the second attenuation transistor based on the power mode being a high-power mode (HPM).

21. The method of claim 19, further comprising biasing, via a bias circuit, the first attenuation transistor and the second attenuation transistor based on the power mode being a low-power mode (LPM).

22. The method of claim 21, wherein the bias circuit comprises a bias transistor coupled between the voltage rail and at least one of a base of the first attenuation transistor or a base of the second attenuation transistor.

23. The method of claim 22, wherein the bias transistor is coupled between the voltage rail and the bases of the first attenuation transistor and the second attenuation transistor.

24. The method of claim 22, wherein biasing the first attenuation transistor and the second attenuation transistor includes sourcing, via a current source of the bias circuit, a current to a current path coupled to a base of the bias transistor.

25. The method of claim 17, wherein:
the first variable resistive element further comprises a first resistive element coupled between the first node and an emitter of the first attenuation transistor; and
the second variable resistive element further comprises a second resistive element coupled between the second node and an emitter of the second attenuation transistor.

26. The method of claim 17, wherein the impedance transformation circuit includes:

a first inductive element coupled between the first node and a reference potential node;

a second inductive element coupled between the second node and the reference potential node; and a capacitive element coupled between the first node and the second node.

27. The method of claim 17, wherein the impedance transformation circuit includes:

a first capacitive element coupled between the first node and a reference potential node;

a second capacitive element coupled between the second node and the reference potential node; and an inductive element coupled between the first node and the second node.

\* \* \* \* \*